United States Patent [19]

Fujita

[11] Patent Number: 5,413,669

[45] Date of Patent: May 9, 1995

[54] METAL CVD PROCESS WITH POST-DEPOSITION REMOVAL OF ALLOY PRODUCED BY CVD PROCESS

[75] Inventor: Toshiaki Fujita, Chiba, Japan

[73] Assignee: Applied Materials, Inc., Santa Clara, Calif.

[21] Appl. No.: 192,686

[22] Filed: Feb. 7, 1994

[51] Int. Cl.[6] .......................... B44C 1/22; C23F 1/00
[52] U.S. Cl. .................. 156/643.1; 437/190; 437/192
[58] Field of Search ............... 156/630, 643, 655, 656, 156/657, 659.1, 662, 664, 665, 646; 252/79.1; 437/189, 190, 191, 192, 193, 194, 195

[56] References Cited

U.S. PATENT DOCUMENTS 5,110,408 5/1992 Fujii et al. .................. 156/656 X

*Primary Examiner*—William Powell
*Attorney, Agent, or Firm*—Robert M. Wallace

[57] ABSTRACT

The invention is a method of reducing alloy particle contamination in processing a semiconductor workpiece having an underlying layer, a metal adhesion layer on the underlying layer and a metal contact layer overlying the adhesion layer, a peripheral portion of the adhesion layer near an edge of the workpiece being exposed and containing an alloy formed during deposition of the metal contact layer, the method including subjecting the workpiece to an etching agent so as to remove a portion of the metal contact layer and at least a portion of the alloy. In a preferred embodiment, the metal contact layer is thicker than the metal adhesion layer so that the method removes a large proportion of the alloy and a smaller proportion of the metal contact layer.

20 Claims, 3 Drawing Sheets

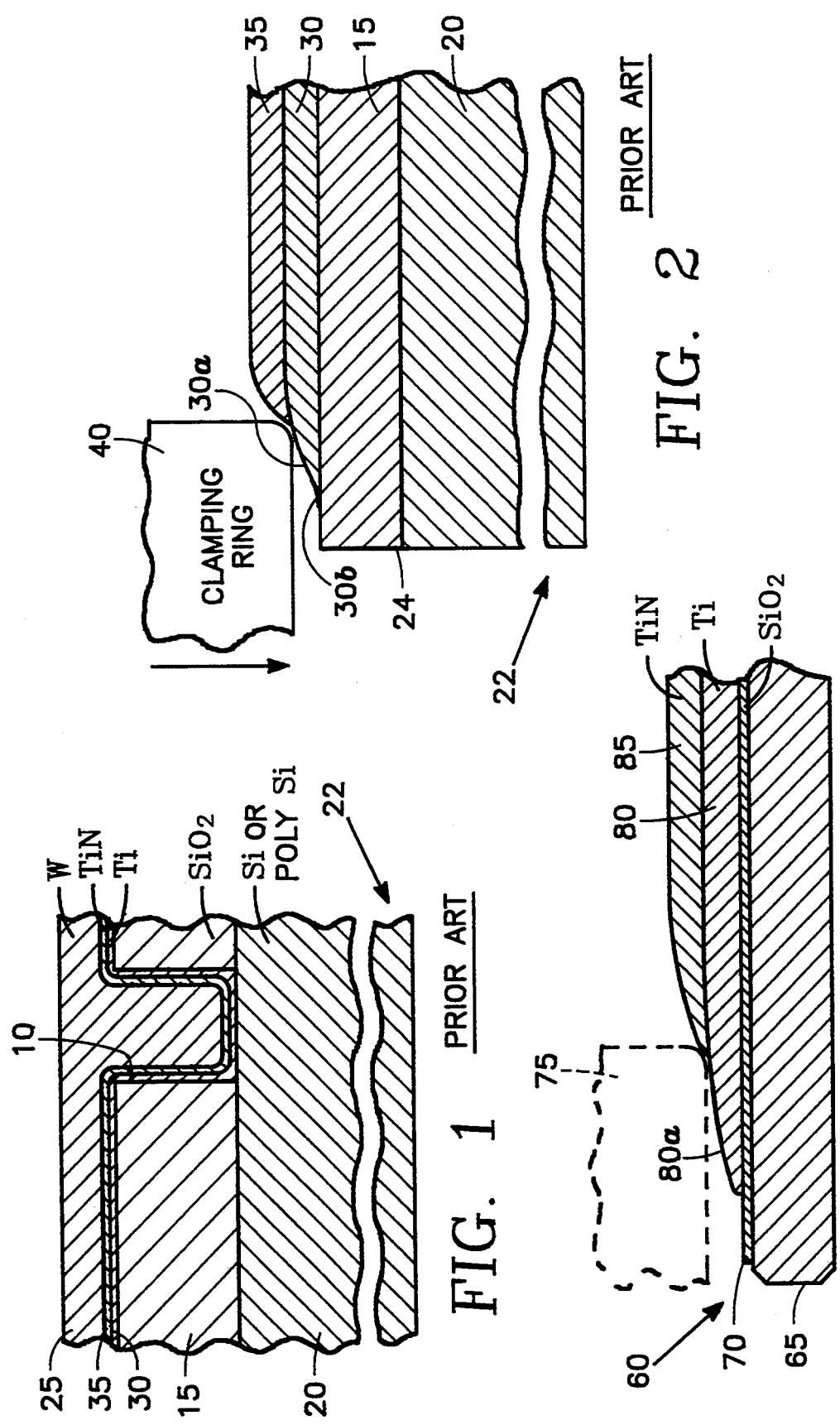

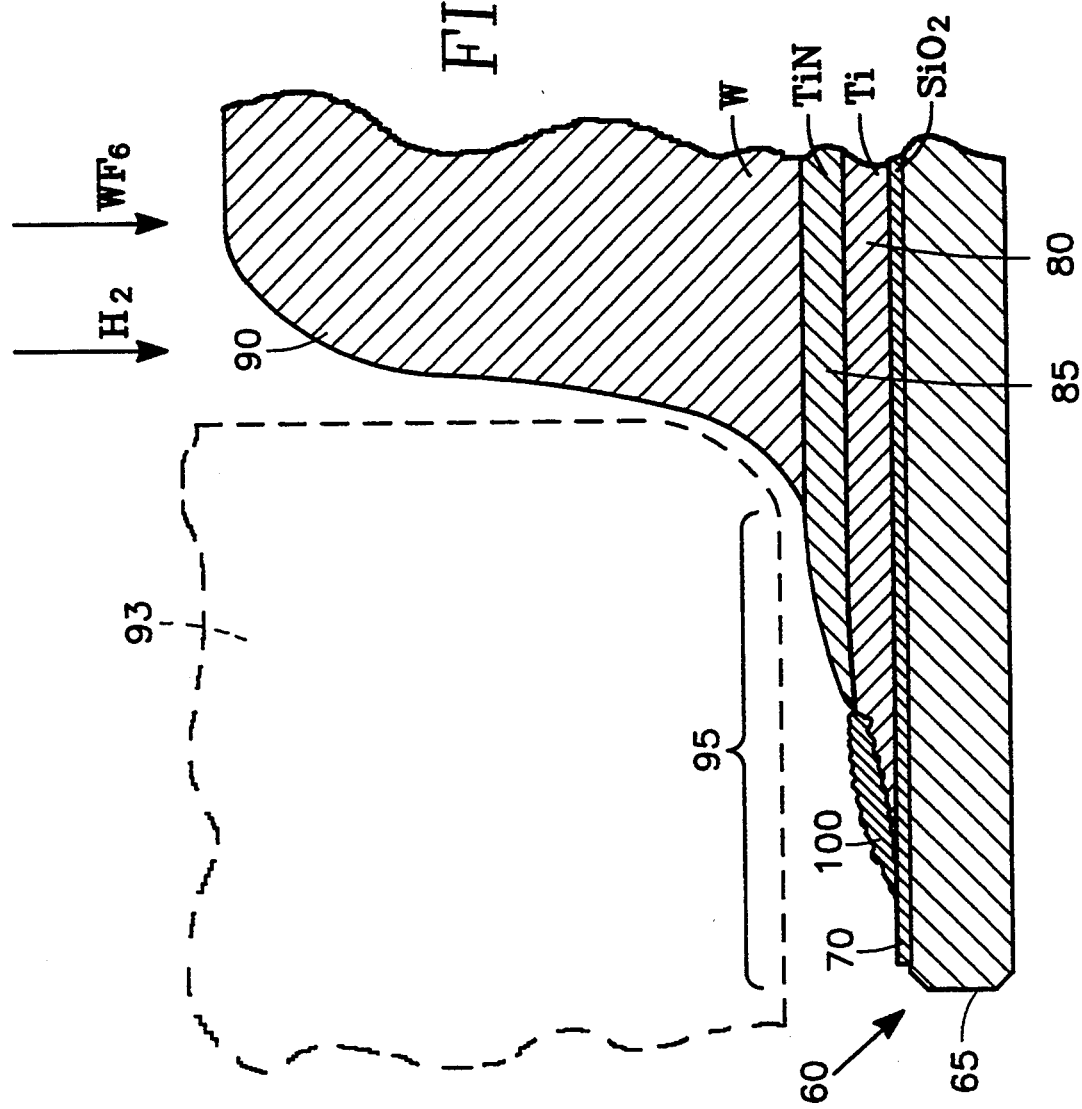

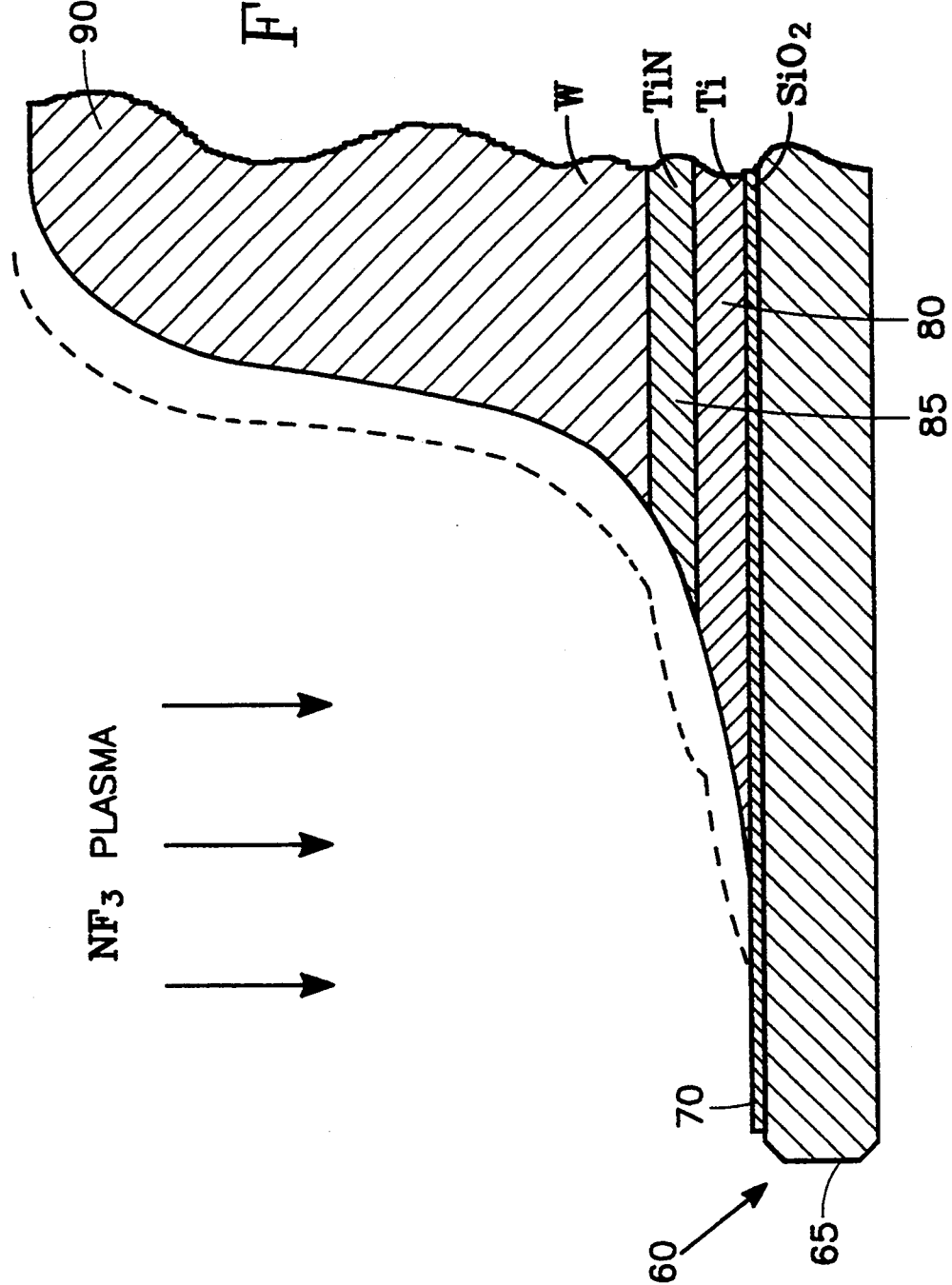

METAL CVD PROCESS WITH POST-DEPOSITION REMOVAL OF ALLOY PRODUCED BY CVD PROCESS

BACKGROUND OF THE INVENTION

1.) Technical Field

The invention relates to chemical vapor deposition (CVD) of metal onto semiconductor structures, and in particular to metal CVD processes employing a metal precursor gas which tends to attack underlying metal layers.

2.) Background Art

Certain types of microelectronic semiconductor structures have plural interconnected conductor layers consisting of conductive materials such as polysilicon, silicon, aluminum, tungsten and so forth. The conductor layers are separated by insulating layers consisting of an insulating material such as silicon dioxide. An interconnection between a pair of conductor layers is provided prior to the formation of the overlying conductor layer by etching a contact opening 10 (as shown in FIG. 1) through the insulator layer 15 overlying the lower conductor layer 20 on a semiconductor wafer 22. The underlying conductor layer 20 is typically silicon or polysilicon. (Alternatively, the underlying conductor layer 20 is the wafer 22 and is crystalline silicon.) Typically, the silicon dioxide insulator layer 15 is about 2000 Angstroms thick while the contact opening 10 is about 500 Angstroms wide, so that the contact opening 15 tends to be deep and narrow, and therefore somewhat difficult to completely fill with a metal contact layer. Filling the contact opening 15 is preferably accomplished by chemical vapor deposition (CVD) of a tungsten contact layer 25 because CVD of tungsten tends to completely fill the deep narrow contact opening 15 better than many other metals and processes. However, tungsten does not adhere well to the silicon dioxide insulating layer 15 and, moreover, forms a relatively high-resistance Schottky barrier contact with the underlying silicon conductive layer 20.

The problems of high contact resistance and poor adhesion is addressed by physical vapor deposition (PVD) of an underlying adhesion layer 30 of titanium prior to the CVD of the tungsten contact layer 25. Preferably, the adhesion layer 30 is between about 100 and 200 Angstroms thick. The titanium adhesion layer 30 adheres well to the underlying silicon conductor layer 20 and provides a lower contact resistance to the silicon conductor layer 20. However, this approach creates another problem in that the tungsten CVD process employs a tungsten precursor gas such as tungsten hexafluoride ($WF_6$) which reacts with the titanium adhesion layer 30 so as to form an alloy of titanium, tungsten and fluorine. In order to shield the titanium adhesion layer 30 from such attack during the tungsten CVD process, a protective titanium nitride layer 35 is formed by PVD over the titanium layer 30 prior to the CVD formation of the tungsten layer 25. Preferably, the titanium nitride protective layer 35 is between about 500 and 1000 Angstroms thick and is relatively immune from attack by the $WF_6$ gas introduced during the subsequent tungsten CVD process. The titanium nitride layer 35 forms an ohmic contact with the underlying titanium layer 30 and with the overlying tungsten contact layer 25.

However, the titanium nitride protective layer 35 does not cover all of the titanium layer 30. The problem is that during the PVD deposition of, first, the titanium layer 30 and, second, the protective titanium nitride layer 35, a circular clamp ring 40 shown in FIG. 2 covers the periphery of the wafer 22 near the wafer edge 24 to hold the wafer 22 in place and to provide better thermal contact between the wafer 22 and the wafer stage inside a PVD reactor. Titanium tends to penetrate under the clamp ring 40 while titanium nitride penetrates thereunder to a far lesser extent. As a result, the titanium adhesion layer 30 underlies the clamp ring 40 by a significant distance (about 0.1 millimeters) while the titanium nitride protective layer 35 essentially stops at the edge of the clamp ring 40, as shown in FIG. 2. This leaves a peripheral annulus 30a of the titanium adhesion layer 30 unprotected by the titanium nitride layer 35, the unprotected annulus 30a being about 0.1 millimeters wide.

Where physical vapor deposition steps of, first, titanium and, second, titanium nitride are performed sequentially in different reactor chambers of a multiple reactor processing system, the unprotected or exposed portion of the titanium layer 30 tends to be even larger. The problem is caused by misalignment of the wafer 22, due to positioning inaccuracies of the wafer-handling apparatus of the PVD system. Specifically, the wafer-handling apparatus of a multiple reactor system delivers the wafer into a reactor chamber using pre-calibrated positioning information. The position calibration is not always adequate to place the same wafer in the same relative position in each of the different chambers in successive processing steps, giving rise to exposure of a greater portion of the titanium layer 30 due to misalignment of the protective titanium nitride layer 35 relative thereto. In such a case, the exposed portion 30a is in the shape of a crescent, rather than an annulus, whose maximum width can be on the order to 1 to 2 mm.

Subsequently, during the CVD formation of the tungsten contact layer 25, the unprotected titanium peripheral annulus (or crescent) 30a is attacked by the $WF_6$ gas introduced during the tungsten CVD process. This forms an alloy of titanium, tungsten and fluorine, $TiW_xF_y$, where x and y can be determined by chemical analysis. Near the edge 30b of the titanium annular periphery 30a, this alloy tends to penetrate to the underlying silicon dioxide layer 15, which causes the titanium layer 30 to delaminate beginning at the edge 30b. During subsequent processing steps, this delamination creates $TiW_xF_y$ particle contamination, greatly reducing process yield. There has seemed to be no way of avoiding such contamination.

SUMMARY OF THE DISCLOSURE

The invention is a method of reducing alloy particle contamination in processing a semiconductor workpiece having an underlying layer, a relatively thin metal adhesion layer on the underlying layer and a relatively thick metal contact layer overlying the adhesion layer, a peripheral portion of the adhesion layer near an edge of the workpiece being exposed and containing an alloy formed during deposition of the metal contact layer, the method including subjecting the workpiece to an etching agent so as to remove a relatively small portion of the metal contact layer and a relatively large portion of the alloy.

BRIEF DESCRIPTION OF THE DRAWINGS

FIG. 1 is a cross-sectional side view of a semiconductor structure including a contact opening through an insulator layer.

FIG. 2 is a cross-sectional side view corresponding to FIG. 1 illustrating a physical vapor deposition step for making the structure of FIG. 1.

FIG. 3 is a cross-sectional view at the wafer edge peripheries of semiconductor structures with different misalignments between the titanium adhesion layer and the titanium nitride protective layer, in accordance with a PVD step carried out in connection with the present invention.

FIG. 4 is a cross-sectional view of a semiconductor structure at the wafer edge peripheries corresponding to FIG. 3 after CVD deposition of the tungsten contact layer, in accordance with the present invention.

FIG. 5 is a cross-sectional view at the wafer edge periphery of a semiconductor structure corresponding to FIG. 4 after post-deposition etch removal of an alloy formed by the tungsten CVD process.

DETAILED DESCRIPTION OF THE PREFERRED EMBODIMENTS

The invention will now be described with reference to a preferred process of the invention. Referring to FIG. 3, a silicon semiconductor wafer 60 having a peripheral edge 65 has an overlying silicon dioxide insulating layer 70 which is typically in some cases in the range of between about 2000 and 5000 Angstroms thick, for example. The wafer 60 is placed inside a physical vapor deposition (PVD) reactor (not shown) and held in place by a clamp ring 75 (dashed line). First, an adhesion layer 80 of titanium is deposited by PVD to a thickness of between 100 and 200 Angstroms. Then, a protective layer 85 of titanium nitride is deposited thereover by PVD to a thickness of between 500 and 1000 Angstroms.

FIG. 3 shows that some of the titanium penetrates under the PVD clamp ring 75 so that the titanium adhesion layer 80 has a peripheral annulus 80a under the clamp ring 75. The titanium nitride does not penetrate significantly under the clamp ring 75, and therefore the peripheral annulus 80a of the titanium layer 80 is exposed. The width W of the peripheral annulus 80a can be in a range between about 0.1 and 0.5 millimeters in some cases. In one example, the PVD of the titanium layer 30 was carried out at a pressure of 0.003 Torr by sputtering titanium at a rate of 600 angstroms per minute in a chamber volume of 20 liters for a duration of 15 seconds.

The next step, as shown in FIG. 4, is to deposit a contact layer 90 of tungsten by a CVD process to a thickness of between about 2000 and 5000 Angstroms. This step is carried out in a CVD reactor (not shown) using a masking ring 93 (dashed line) which masks or shadows a peripheral annulus 95 of the wafer in order to suppress deposition of tungsten near the wafer edge (which would otherwise cause delamination during subsequent processing steps). This step is carried out by introducing tungsten hexafluoride ($WF_6$) gas and hydrogen gas into the CVD reactor. During this step, the exposed titanium peripheral annulus 80a is attacked by the $WF_6$. The $WF_6$ gas penetrates under the masking ring 93 to produce an alloyed region 100 in the exposed titanium annulus 80a consisting of $TiW_xF_y$. The size of the alloyed region 100 is determined by the width of the exposed titanium peripheral annulus 80a.

In one working example, the tungsten CVD process was carried out pyrolitically in a commercially available plasma CVD reactor at a chamber pressure of 80 Torr in a chamber volume of 5 liters at a temperature of 450 degrees C with a flow rate of tungsten hexafluoride of 75 sccm and a flow rate of hydrogen of 1000 sccm.

FIG. 5 illustrates a finishing step in the process of the invention, in which the structure of FIG. 4 is exposed to an etchant gas such as $NF_3$ with a sufficient mass flow rate, sufficient reaction energy and for a sufficient time so as to etch away just enough exposed material to remove the alloyed region 100. During this step, the wafer 60 is moved well-below the masking ring 93 so that the masking ring 93 does not interfere with the etch process near the wafer periphery. Since the titanium layer 80 is between 100 and 200 Angstroms thick, it is preferable to over-etch by removing about 500 Angstroms of material to guarantee complete removal of the alloyed region 100.

While this etch step removes about 500 Angstroms of tungsten from the tungsten layer 90, the amount removed as a fraction of the original thickness of the tungsten layer (i.e., 2000 to 5000 Angstroms) is so small that the resulting degradation of thickness uniformity of the remaining of the tungsten layer 90 is negligible. (In one example, the etching uniformity of this last etch step is about ±10%.) FIG. 5 indicates the original boundary of the tungsten layer 90 in phantom line in order to indicate the relatively small fraction of the tungsten layer 90 that is removed in this final etch step.

With the removal of the alloyed region 100, there is no alloy particle contamination in subsequent processing steps, a significant advantage.

In one working example, the final etch step depicted in FIG. 5 was carried out in an inductively coupled plasma CVD reactor in a chamber volume of 5 liters at a pressure of 0.3 Torr with a mass flow rate of $NF_3$ of 150 sccm (standard cubic centimeters per minute) with applied RF power of 300 watts at an RF frequency of 13.56 MHz for a duration of two seconds at a temperature of 475 degrees C.

The duration of the post-deposition etch step can be varied to change the amount of material removed. For example, some of the titanium nitride protective layer 85 remains following the post-deposition etch step, while in an alternative embodiment the duration is increased so that all of the exposed titanium nitride layer 85 not directly underlying the tungsten layer 90 is removed.

While the invention has been described in detail with referenced to preferred embodiments, it is understood that modifications and variations thereof may be made without departing from the true spirit and scope of the invention.

What is claimed is:

1. A method of reducing alloy particle contamination in processing a semiconductor workpiece having an underlying layer, a metal adhesion layer on said underlying layer and a metal contact layer overlying said adhesion layer, a peripheral portion of said adhesion layer near an edge of said workpiece being exposed and containing an alloy formed during deposition of said metal contact layer, said method comprising:

subjecting said workpiece to an etching agent so as to remove a portion of said metal contact layer and at least a portion of said alloy.

2. The method of claim 1 wherein said metal contact layer is thicker than said metal adhesion layer whereby the subjecting step removes a large proportion of said alloy and a smaller proportion of said metal contact layer.

3. The method of claim 1 wherein said etching agent comprises $NF_3$.

4. The method of claim 1 wherein said underlying layer comprises silicon dioxide and said adhesion layer comprises titanium.

5. The method of claim 2 wherein said metal contact layer is on the order of more than five times as thick as said metal adhesion layer.

6. A method of reducing alloy particle contamination in processing a semiconductor workpiece having a non-insulating layer, an insulator layer overlying said non-insulating layer having contact openings therethrough exposing contact portions of said semiconductor layer, a metal adhesion layer on said insulating layer and on the contact portions of said non-insulating layer and a metal contact layer overlying said adhesion layer, a peripheral portion of said adhesion layer near an edge of said workpiece being exposed and containing an alloy formed during deposition of said metal contact layer, said method comprising:

subjecting said workpiece to an etching agent so as to remove a portion of said metal contact layer and at least a portion of said alloy.

7. The method of claim 6 wherein said metal contact layer is thicker than said metal adhesion layer whereby the subjecting step removes a large proportion of said alloy and a smaller proportion of said metal contact layer.

8. The method of claim 6 wherein said etching agent comprises $NF_3$.

9. The method of claim 6 wherein:

said non-insulating layer comprises one of the following: (a) silicon, (b) polysilicon, (c) aluminum and (d) tungsten;

said insulating layer comprises silicon dioxide; and said adhesion layer comprises titanium.

10. The method of claim 9 wherein said workpiece further comprises a titanium nitride protective layer between said adhesion layer and said metal contact layer.

11. The method of claim 7 wherein said metal contact layer is on the order of more than five times as thick as said metal adhesion layer.

12. A method of processing a semiconductor wafer, comprising:

forming an insulator layer over a non-insulating layer of said wafer;

first depositing a metal adhesion layer over said insulator layer and then a conductive protective layer over said adhesion layer while holding said wafer with a clamp over the edge periphery of said wafer, leaving a peripheral portion of said adhesion layer uncovered by said protective layer;

second depositing by chemical vapor deposition a contact metal layer on said adhesion layer using gases which form reactants which attack said uncovered peripheral portion of said adhesion layer, so as to form an alloy in said adhesion layer; and exposing said wafer to an etching agent so as to remove a portion of said contact metal layer and at least a portion of said alloy.

13. The method of claim 12 wherein said metal contact layer is thicker than said metal adhesion layer whereby the exposing step removes a large proportion of said alloy and a smaller proportion of said metal contact layer.

14. The method of claim 12 wherein said second depositing step is preceded by placing a masking ring near the edge periphery of said wafer so as to suppress deposition of said metal contact layer near said wafer edge periphery and wherein said exposing step is preceded by withdrawing said masking ring from said wafer.

15. The method of claim 12 wherein said wafer is silicon, said insulator layer is silicon dioxide, said adhesion layer is titanium and said contact layer is tungsten.

16. The method of claim 15 wherein said non-insulating layer comprises one of the following: (a) silicon, (b) aluminum, (c) polysilicon and (d) tungsten.

17. The method of claim 15 wherein said non-insulating layer comprises the silicon surface of said wafer.

18. The method of claim 12 wherein said gases comprise a tungsten fluoride gas.

19. The method of claim 12 wherein said exposing step removes about 500 Angstroms of said adhesion layer.

20. The method of claim 13 wherein said metal contact layer is on the order of more than five times as thick as said metal adhesion layer.

* * * * *